United States Patent
Yang et al.

(10) Patent No.: US 9,947,624 B2
(45) Date of Patent: Apr. 17, 2018

(54) SEMICONDUCTOR PACKAGE ASSEMBLY WITH THROUGH SILICON VIA INTERCONNECT

(71) Applicant: MediaTek Inc., Hsin-Chu (TW)

(72) Inventors: Ming-Tzong Yang, Baoshan Township, Hsinchu County (TW); Cheng-Chou Hung, Hukou Township, Hsinchu County (TW); Wei-Che Huang, Zhudong Township, Hsinchu County (TW); Yu-Hua Huang, Hsinchu (TW); Tzu-Hung Lin, Zhubei (TW); Kuei-Ti Chan, Hsinchu (TW); Ruey-Beei Wu, Taipei (TW); Kai-Bin Wu, Kaohsiung (TW)

(73) Assignee: MediaTek Inc., Hsin-Chu (TW)

(*) Notice: Subject to any disclaimer, the term of this patent is extended or adjusted under 35 U.S.C. 154(b) by 0 days.

(21) Appl. No.: 15/393,387

(22) Filed: Dec. 29, 2016

(65) Prior Publication Data
US 2017/0110406 A1 Apr. 20, 2017

Related U.S. Application Data

(63) Continuation of application No. 14/963,451, filed on Dec. 9, 2015, now Pat. No. 9,570,399.
(Continued)

(51) Int. Cl.
*H01L 23/538* (2006.01)
*H01L 25/065* (2006.01)
(Continued)

(52) U.S. Cl.
CPC .... *H01L 23/5384* (2013.01); *H01L 21/76802* (2013.01); *H01L 21/76877* (2013.01);
(Continued)

(58) Field of Classification Search
CPC .......... H01L 23/5384; H01L 23/49816; H01L 23/49838; H01L 23/5386; H01L 21/76802;
(Continued)

(56) References Cited

U.S. PATENT DOCUMENTS 7,701,057 B1 4/2010 Rahman et al.
8,338,961 B2 12/2012 Su
(Continued)

*Primary Examiner* — Alonzo Chambliss
(74) *Attorney, Agent, or Firm* — Wolf, Greenfield & Sacks, P.C.

(57) ABSTRACT

The invention provides a semiconductor package assembly with a TSV interconnect. The semiconductor package assembly includes a first semiconductor package mounted on a base, having: a semiconductor die, a semiconductor substrate, and a first array of TSV interconnects and a second array of TSV interconnects formed through the semiconductor substrate, wherein the first array and second array of TSV interconnects are separated by an interval region. The assembly further includes a second semiconductor die mounted on the first semiconductor package, having a ground pad thereon. One of the TSV interconnects of the first semiconductor package has a first terminal coupled to the ground pad of the second semiconductor die and a second terminal coupled to an interconnection structure disposed on a front side of the semiconductor substrate.

21 Claims, 9 Drawing Sheets

Related U.S. Application Data

(60) Provisional application No. 62/095,880, filed on Dec. 23, 2014.

(51) Int. Cl.
*H01L 23/48* (2006.01)
*H01L 21/768* (2006.01)
*H01L 23/498* (2006.01)
*H01L 23/00* (2006.01)

(52) U.S. Cl.
CPC ...... *H01L 21/76898* (2013.01); *H01L 23/481* (2013.01); *H01L 23/49816* (2013.01); *H01L 23/49838* (2013.01); *H01L 23/5386* (2013.01); *H01L 24/14* (2013.01); *H01L 25/0657* (2013.01); *H01L 2224/16146* (2013.01); *H01L 2225/06541* (2013.01); *H01L 2225/06544* (2013.01)

(58) Field of Classification Search
CPC ......... H01L 21/76877; H01L 21/76898; H01L 24/14; H01L 25/0657
See application file for complete search history.

(56) References Cited

U.S. PATENT DOCUMENTS

| | | | |
|---|---|---|---|
| 8,344,512 B2 | 1/2013 | Knickerbocker | |
| 8,810,011 B2* | 8/2014 | Pagaila | H01L 23/147 257/660 |
| 9,570,399 B2* | 2/2017 | Yang | H01L 23/481 |
| 2009/0315156 A1* | 12/2009 | Harper | H01L 23/552 257/660 |
| 2010/0225005 A1 | 9/2010 | Nishio et al. | |
| 2011/0042795 A1 | 2/2011 | Knickerbocker | |
| 2011/0291289 A1 | 12/2011 | Yoon | |
| 2012/0280366 A1 | 11/2012 | Kamgaing et al. | |
| 2013/0082364 A1 | 4/2013 | Wang | |
| 2013/0082365 A1 | 4/2013 | Bernier | |
| 2013/0277861 A1 | 10/2013 | Suh | |
| 2013/0316530 A1 | 11/2013 | Law et al. | |
| 2014/0159231 A1 | 6/2014 | Lundberg | |
| 2016/0118354 A1 | 4/2016 | Goh | |

* cited by examiner

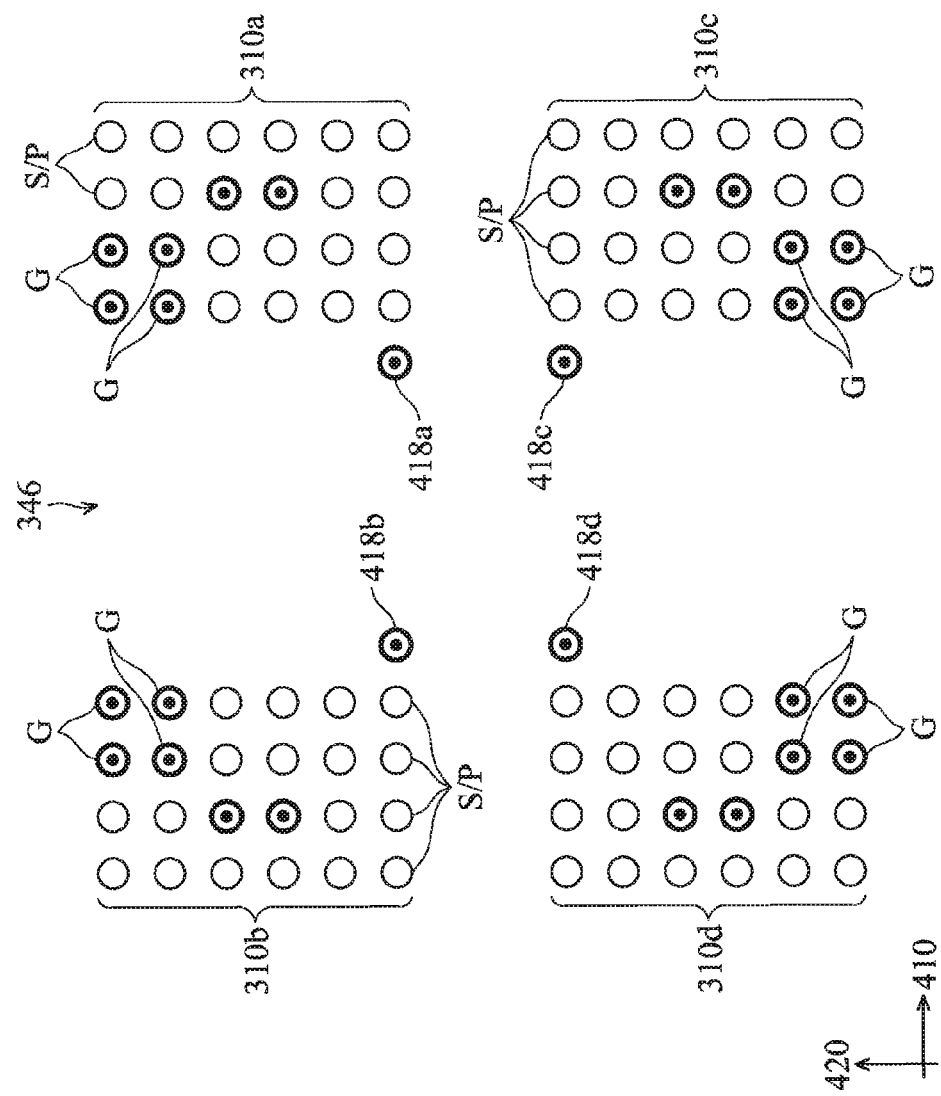

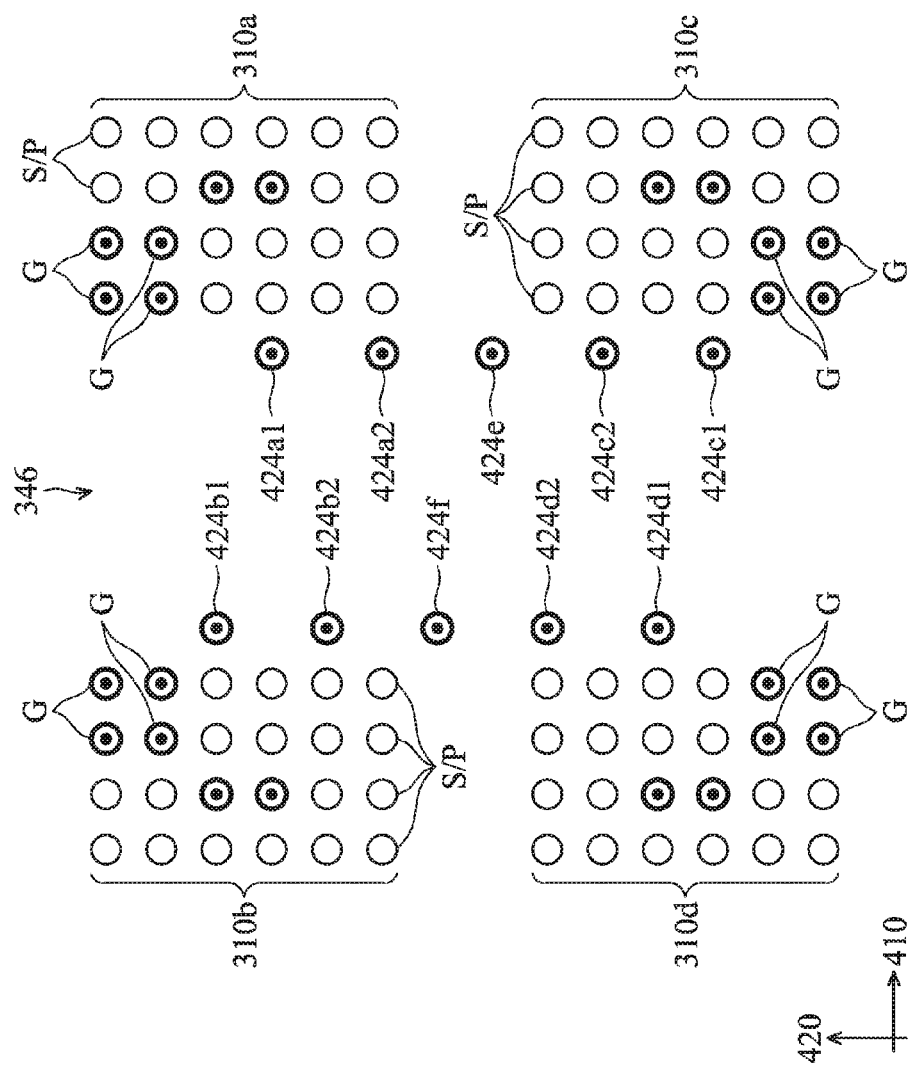

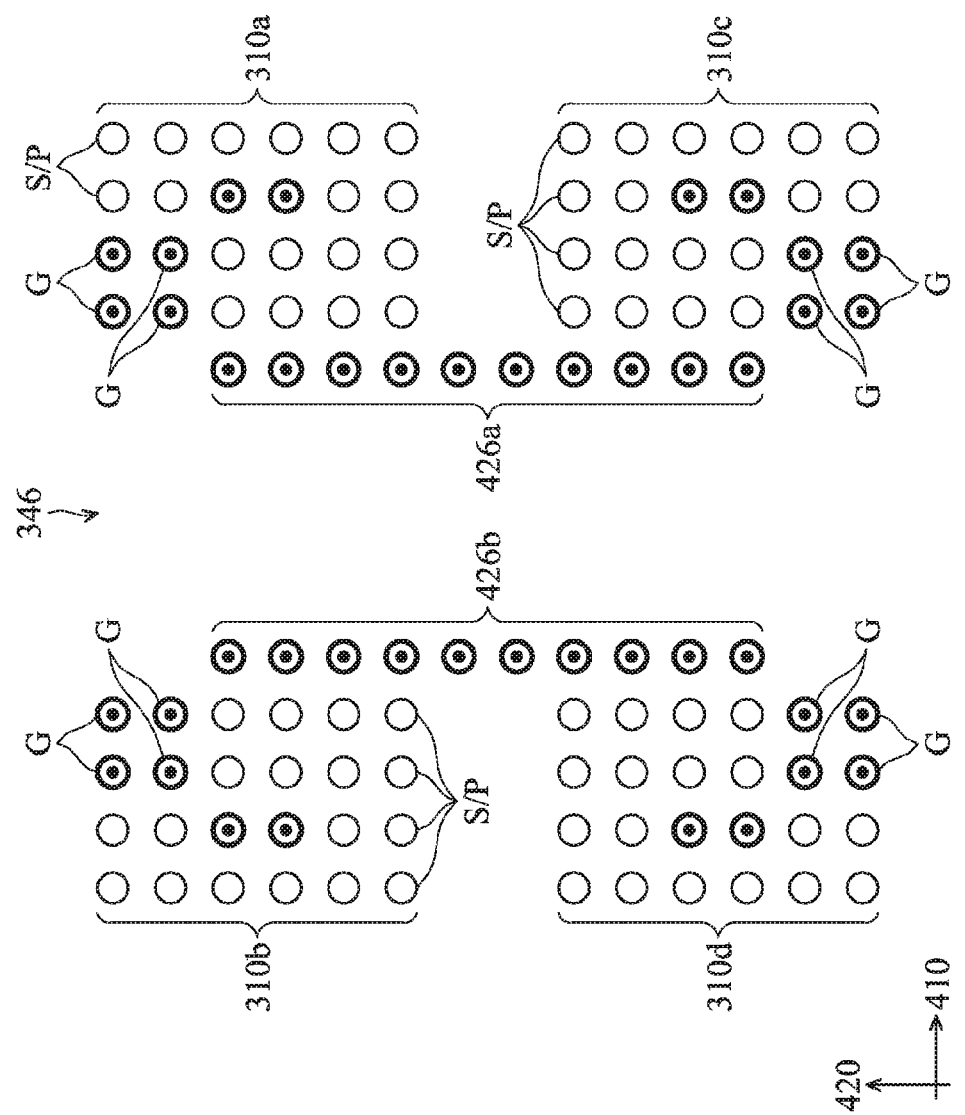

SEMICONDUCTOR PACKAGE ASSEMBLY WITH THROUGH SILICON VIA INTERCONNECT

CROSS REFERENCE TO RELATED APPLICATIONS

This application is a Continuation of pending U.S. patent application Ser. No. 14/963,451, filed on Dec. 9, 2015, which claims the benefit of U.S. Provisional Application No. 62/095,880 filed Dec. 23, 2014, the entireties of which are incorporated by reference herein.

BACKGROUND OF THE INVENTION

Field of the Invention

The present invention relates to a semiconductor package assembly, and in particular to ground TSV interconnect arrangements for the three-dimensional (3D) semiconductor package assembly.

Description of the Related Art

For electronics engineering, a through silicon via (TSV) is a vertical electrical connection which passes completely through a silicon wafer or die. A TSV is formed by high-performance techniques, when compared to alternatives such as package-on-package. A TSV is used to create three-dimensional (3D) semiconductor packages and 3D integrated circuits. The density of the via of a TSV is substantially higher than the alternatives as the length of connections are shorter.

For memory applications with increased levels of integration as well as improved performance, bandwidth, latency, power, weight and form factor, the signal pad to ground pad ratio becomes important to improve the coupling effect.

Thus, a novel 3D semiconductor package is desirable.

BRIEF SUMMARY OF THE INVENTION

A semiconductor package assembly with a through silicon via (TSV) interconnect is provided. An exemplary embodiment of a semiconductor package assembly with a TSV interconnect includes a first semiconductor package mounted on a base, comprising: a semiconductor die; a semiconductor substrate; and a first array of TSV interconnects and a second array of TSV interconnects formed through the semiconductor substrate, wherein the first array and second array of TSV interconnects are separated by an interval region. The interconnect also includes a second semiconductor die mounted on the first semiconductor package, having a ground pad thereon, wherein one of the TSV interconnects of the first semiconductor package has a first terminal coupled to the ground pad of the second semiconductor die and a second terminal coupled to an interconnection structure disposed on a front side of the semiconductor substrate.

Another exemplary embodiment of a semiconductor package assembly with a through silicon via (TSV) interconnect, comprising: a first semiconductor package mounted on a base, comprising: a semiconductor substrate; a first array of TSV interconnects and a second array of TSV interconnects formed through the semiconductor substrate, wherein the first array and second array of TSV interconnects are separated by an interval region; a first ground TSV interconnect disposed within the interval region, coupled to an interconnection structure disposed on a front side of the semiconductor substrate; and a conductive layer pattern disposed on a back side of the semiconductor substrate, in connection with to the first ground TSV interconnect and a second ground TSV interconnect of the first array of TSV interconnects or the second array of TSV interconnects of the first semiconductor package.

Yet another exemplary embodiment of a semiconductor package assembly with a through silicon via (TSV) interconnect, comprising: a first semiconductor package mounted on a base, comprising: a semiconductor substrate; a first array of TSV interconnects and a second array of TSV interconnects formed through the semiconductor substrate, wherein the first array and second array of TSV interconnects are separated by an interval region; and a first ground TSV interconnect disposed within the interval region, wherein the first ground TSV interconnect of the first semiconductor package has a first terminal coupled to a second ground TSV interconnect of the first array of TSV interconnects or the second array of TSV interconnects of the first semiconductor package and a second terminal coupled to the input signal ground (Vss), and wherein the first ground TSV interconnect is separated from the first array of TSV interconnects by a first distance larger than a pitch of the first array of TSV interconnects.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 3A to 3G are enlarged views of FIG. 2 showing the arrangement of the ground TSV interconnect disposed within an interval region between the TSV arrays, in accordance with some embodiments of the disclosure.

DETAILED DESCRIPTION OF THE INVENTION

Figure 1:
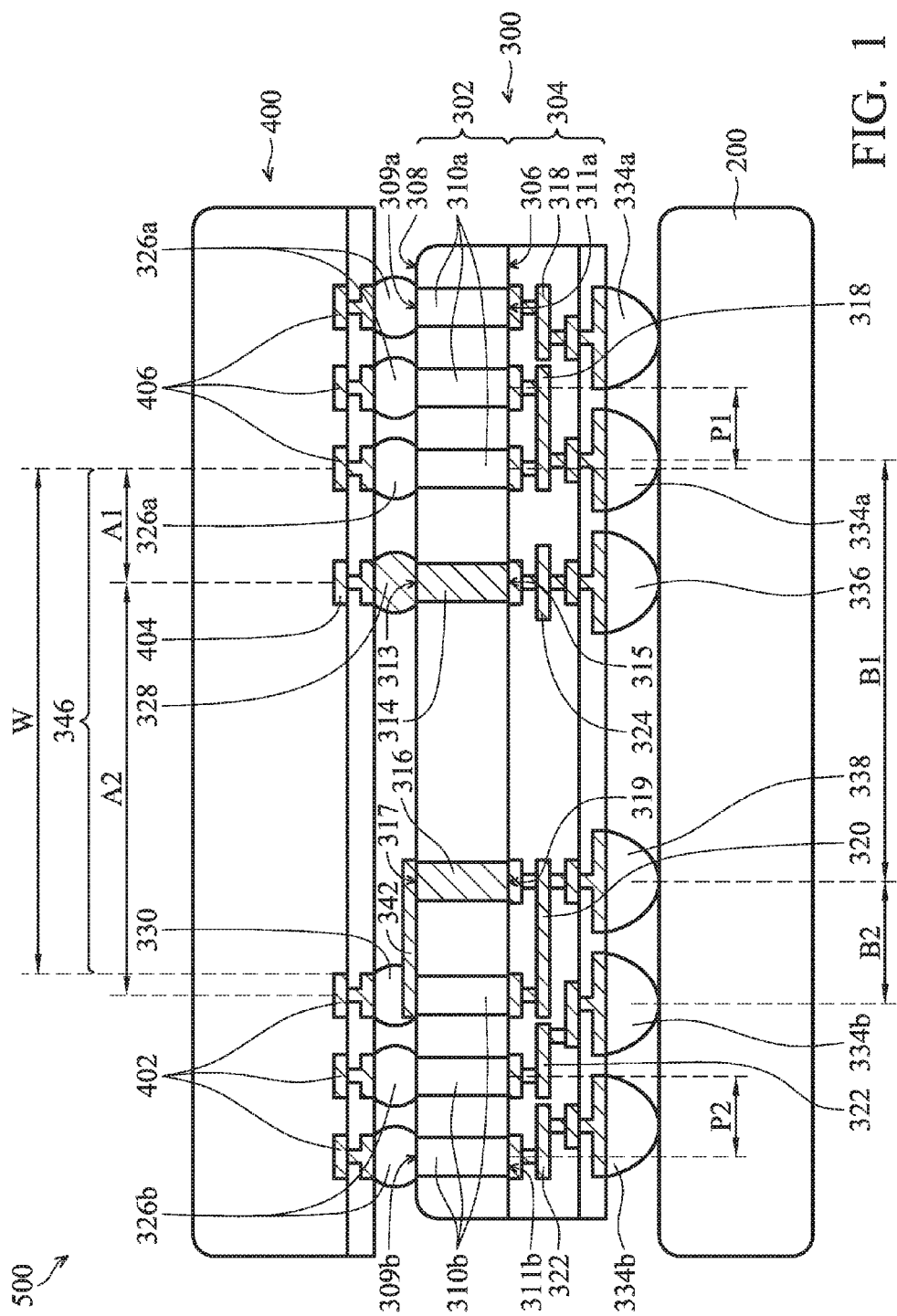
FIG. 1 is a cross-sectional view of a semiconductor package assembly with a through silicon via (TSV) interconnect in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a cross-sectional view of a semiconductor package assembly 500 with a through silicon via (TSV) interconnect in accordance with some embodiments of the disclosure. In some embodiments, the semiconductor package assembly 500 may serve as a three-dimensional (3D) semiconductor package assembly 500. In some embodiments, the 3D semiconductor package assembly 500 includes at least two vertically stacked semiconductor dies. In this embodiment, the 3D semiconductor package assembly 500 includes a system on chip (SOC) die, such as a logic die, and a memory die, such as a dynamic random access memory (DRAM) package, directly stacked on the SOC die. As shown in FIG. 1, the 3D semiconductor package assembly 500 includes a first semiconductor die 300 mounted on a base 200, and a second semiconductor die 400 stacked on the first semiconductor die 300. In some embodiments, the first semiconductor die 300 is fabricated by the TSV technology. A plurality of TSV interconnects is formed close to a back side of the first semiconductor die 300 for the second semiconductor die 400 directly stacked thereon and coupled thereto. A plurality of conductive bumps is formed close to a front side of the first semiconductor die 300 to bond on the base 200.

As shown in FIG. 1, the first semiconductor die 300 may include a semiconductor substrate 302, which has a front side 306 and a back side 308 opposite to the front side 306 in accordance with some embodiments of the disclosure. In one embodiment, the semiconductor substrate 302 may comprise silicon. In alternative embodiments, an SiGe, bulk semiconductor, strained semiconductor, compound semiconductor, silicon on insulator (SOI), and other commonly used semiconductor substrates can be used as the semiconductor substrate 302. The semiconductor substrate 302 may have a desired conductive type by implanting p-type or n-type impurities therein. In some embodiments, an integrated circuit device (not shown), such as a transistor, is formed on the front side 306 of the semiconductor substrate 302. A dielectric layer laminating structure 304 is formed on the front side 306 of the semiconductor substrate 302. A plurality of interconnect structures (including interconnect structures 318, 320, 322 and 324) is formed on the front side 306 of the semiconductor substrate 302, in the dielectric layer laminating structure 304. In one embodiment, the interconnect structure 222 may be constructed by contacts, via and metal layer patterns, and the metal layer patterns are disposed vertically between the contacts and via and/or vias in different layer levels. The number of metal layer patterns is defined by design for the first semiconductor die 300 and the scope of the invention is not limited thereto.

In some embodiments as shown in FIG. 1, the first semiconductor die 300 may further include TSV interconnects 310a, 310b, 314 and 316 formed through the semiconductor substrate 302 from the back side 308 of the semiconductor substrate 302. As shown in FIG. 1, the TSV interconnects 310a are arranged as a first array having a pitch P1. Also, the TSV interconnects 310 are arranged as a second array having a pitch P2. In some embodiments, the pitch P1 of the first array may be designed to be equal to the pitch P2 of the second array. In some embodiments, the first array of TSV interconnects 310a and the second array of TSV interconnects 310b are used to transmit input/output (I/O), ground or power signals from the second semiconductor die 400 to the base 200. In some embodiments, the first array of TSV interconnects 310a and the second array of TSV interconnects 310b are separated by an interval region 346 to follow the pin assignment rule (such as JEDEC Wide I/O Memory specification) for the second semiconductor die 400 mounted thereon. In some embodiments, the interval region 346 may have a width W greater than the pitch P1 of the first array of TSV interconnects 310a and the pitch P2 of the second array of TSV interconnects 310b. It should be noted that the number of TSV interconnects in the array is defined by design for the first semiconductor die 300 and the second semiconductor die 400 mounted thereon and the scope of the disclosure is not limited. Also, the number of the TSV interconnects of the first array or second array of TSV interconnects is defined by design for the first semiconductor die 300 and the second semiconductor die 400 mounted thereon and the scope of the disclosure is not limited thereto.

In some embodiments as shown in FIG. 1, each of the TSV interconnects 310a of the first array of TSV interconnects has two terminals 309a and 311a. The terminal 309a is aligned to the back side 308 of the semiconductor substrate 302, and the terminal 311a is close to (or aligned to) the front side 306 of the semiconductor substrate 302. Similarly, each of the TSV interconnects 310b of the second array of TSV interconnects has two terminals 309b and 311b in accordance with some embodiments of the disclosure. The terminal 309b is aligned to the back side 308 of the semiconductor substrate 302, and the terminal 311b is close to (or aligned to) the front side 306 of the semiconductor substrate 302. In some embodiments as shown in FIG. 1, the terminal 311a of each of the TSV interconnects 310a of the first array of TSV interconnects may be in connection with a first-layer metal pattern (M1) of the interconnection structure 318. Also, the interconnection structures 318 correspond to the TSV interconnects 310a of each of the first array of TSV interconnects, respectively. In some embodiments as shown in FIG. 1, the terminal 311b of each of the TSV interconnects 310b of the second array of TSV interconnects may be in connection with a first-layer metal pattern (M1) of each of the interconnection structure 322. Also, the interconnection structures 322 correspond to the TSV interconnects 310b of the second array of TSV interconnects, respectively.

In some embodiments as shown in FIG. 1, conductive bumps 334a, 334b, 336, 338 are disposed on the interconnect structures 318, 320, 322 and 324 of the first semiconductor die 300 and in contact with the base 200. The conductive bumps 334a, 334b, 336, 338 may be coupled to the interconnect structures 318, 320, 322 and 324 through redistribution layer (RDL) patterns formed on the dielectric layer laminating structure 304. The conductive bumps 334a are arranged as an array corresponding to the first array of TSV interconnects 310a, and connect to the corresponding TSV interconnects 310a. Also, the conductive bumps 334b are arranged as an array corresponding to the second array of conductive bumps 326b.

In some embodiments as shown in FIG. 1, a second semiconductor die 400 is mounted on the first semiconductor die 300. In some embodiments, the second semiconductor die 400 may include a memory die, such as a dynamic random access memory (DRAM) die, with a numbers of pads 402, 404 and 406 thereon to transmit input/output (I/O), ground or power signals of the integrated circuit devices and/or circuits fabricated therein. As shown in FIG. 1, the pads 402 of the second semiconductor die 400 are arranged in an array, the pads 406 are also arranged in another array. The array of pads 402 and the array of pads 406 are separated from each other through an interval region (corresponding to the interval region 346) to follow the pin assignment rule (such as JEDEC Wide I/O Memory specification). As shown in FIG. 1, the first array of TSV interconnects 310a of the first semiconductor die 300 are arranged corresponding to the array of pads 402. The second array of TSV interconnects 310b of the first semiconductor die 300 are also arranged corresponding to the array of pads 406. The pads 402 of the second semiconductor die 400 are coupled to the TSV interconnects 310a of the first semiconductor die 300 through conductive bumps 326a disposed on the terminals 309a of the TSV interconnects 310a. The conductive bumps 326a are in contact with the pads 402 of the second semiconductor die 400 and the TSV interconnects 310a of the first semiconductor die 300. The pads 406 of the second semiconductor die 400 are coupled to the TSV interconnects 310b of the first semiconductor die 300 through conductive bumps 326b disposed on the terminals 309b of the TSV interconnects 310b. The conductive bumps 326b are in contact with the pads 406 of the second semiconductor die 400 and the TSV interconnects 310b of the first semiconductor die 300. It should be noted that a dimension (such as a width) of the conductive bumps 326a and 326b is designed to have a dimension (such as a width) less than the corresponding dimension of the conductive bumps 334a, 334b, 336 and 338.

Figure 2:
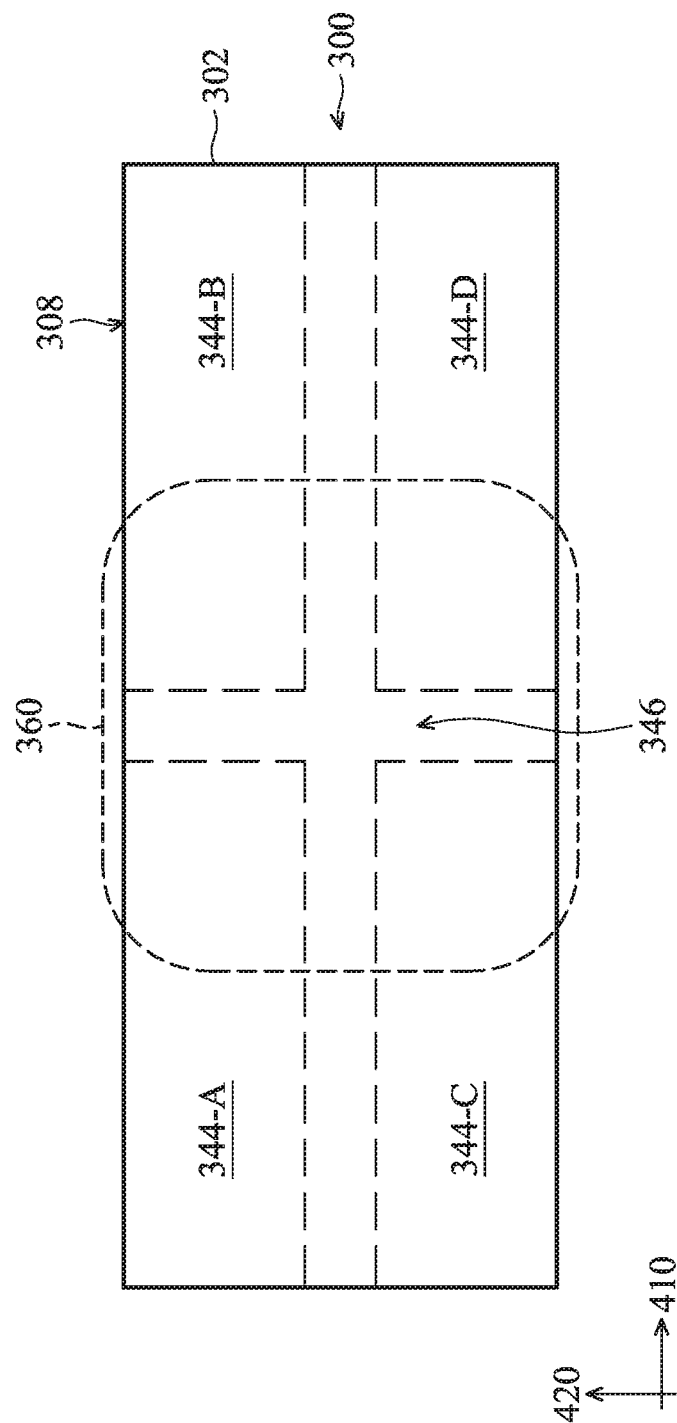
FIG. 2 is a bottom view of a semiconductor die of a semiconductor package assembly with a through silicon via (TSV) interconnect, showing the arrangement of TSV array regions of the semiconductor package, in accordance with some embodiments of the disclosure.

FIG. 2 is a bottom view of the first semiconductor die 300 of the semiconductor package assembly 500 as shown in FIG. 1. FIG. 2 shows the arrangement of TSV array regions from the back side 308 of the semiconductor substrate 302. For the description of the coupling effect between the TSV array regions 344-A, 344-B, 344-C and 344-D, the TSV interconnects 314 and 316 are not illustrated herein. In some embodiments, four array regions, such as array regions TSV 344-A, 344-B, 344-C and 344-D, are arranged within the semiconductor substrate 302 of the first semiconductor die 300. Each of the array regions 344-A, 344-B, 344-C and 344-D provides for an array of TSV interconnects (such as the first array of TSV interconnects 310a or the second array of TSV interconnects 310b as shown in FIG. 1) disposed within. The arrays of TSV interconnects disposed within the TSV array regions 344-A, 344-B, 344-C and 344-D are used to transmit input/output (I/O), ground or power signals from the memory die, such as the second semiconductor die 400, to the base 200. Also, the TSV array regions 344-A, 344-B, 344-C and 344-D are separated from each other through the interval region 346. In some embodiments, the interval region 346 is cross-shaped and is extended along a direction 410 and a direction 420 perpendicular to each other. It should be noted that the number of arrays of TSV interconnects is defined by design for the first semiconductor die 300 and the second semiconductor die 400 mounted thereon and the scope of the disclosure is not limited. Accordingly, the interval region 346 may have various shapes to correspond to the arrangement of TSV array regions, and the scope of the disclosure is not limited thereto.

As shown in FIG. 2, the signal to ground TSV interconnects ratio disposed within the TSV array regions 344-A, 344-B, 344-C and 344-D and close to the interval region 346 along the direction 410 may be different from that close to the interval region 346 along the direction 420. For example, for following JEDEC Wide I/O Memory specification, the signal to ground TSV interconnects ratio close to the interval region 346 along the direction 410 is smaller than that close to the interval region 346 along the direction 420. Therefore, the coupling effect between the TSV array regions 344-A and 344-B may be different from that between the TSV array regions 344-A and 344-D (or inside the TSV array region 344-A). For example, the coupling between the TSV array regions 344-A and 344-B is much smaller than that between the TSV array regions 344-A and 344-D (or inside the TSV array region 344-A).

In some embodiments as shown in FIG. 1, the first semiconductor die 300 of the semiconductor package assembly 500 may have one or more ground TSV interconnects, such as the ground TSV interconnects 314 and/or 316, arranged within the interval region 346. The ground TSV interconnects 314 and/or 316 are designed to provide additional ground paths to balance the coupling effect between the TSV array regions 344-A to 344-D along the different directions, such as the directions 410 and 420. In some embodiments, the ground TSV interconnect 314 has a first terminal 313 aligned to the back side 308 of the semiconductor substrate 302 and a second terminal 315 opposite to the first terminal 313. The first terminal 313 of the TSV ground structure 314 is designed to be coupled to an additional ground pad 404 of the second semiconductor die 400. In some embodiments, the ground pad 404 of the second semiconductor die 400 also provide additional ground paths to balance the coupling effect between the array regions of pads (such as the pads 402 and 406). Also, the second terminal 315 of the ground TSV interconnect 314 is designed to be coupled to an additional interconnection structure 324 disposed on the front side 306 of the semiconductor substrate 300. In some embodiments, the second terminal 315 of the ground TSV interconnect 314 may be coupled to the input signal ground (Vss) through the interconnection structure 324. Also, the interconnection structure 324 is coupled to the base 200 through the conductive bump 336. As shown in FIG. 1, the ground TSV interconnect 314 is separated from the first array of TSV interconnects 310a and the second array of TSV interconnects 310b by a first distance A1 and a second distance A2, respectively. In some embodiments, at least one of the first distance A1 and the second distance A2 is designed to be larger than the pitch P1 of the first array of TSV interconnects 310a or P2 of the second array of TSV interconnects 310b.

As shown in FIG. 1, the ground TSV interconnect 316 has a first terminal 317 aligned to the back side 308 of the semiconductor substrate 302 and a second terminal 319 opposite to the first terminal 317. In some embodiments, a conductive layer pattern 342, such as a redistribution layer (RDL) pattern 342, is designed to be disposed on the back side 308 of the semiconductor substrate 302. The conductive layer pattern 342 is in connection with the first terminal 317 of the ground TSV interconnect 316 and the first terminal of at least one of the ground TSV interconnects of the first array of TSV interconnects or the second array of TSV interconnects of the first semiconductor die 300. For example as shown in FIG. 1, the conductive layer pattern 342 is in connection with the first terminal 317 of the ground TSV interconnect 316 and the first terminal 309b of the ground TSV interconnect, which belongs to the second array of TSV interconnects 310b. The ground TSV interconnect 316 may also be coupled to a ground pad (one of the pads 406) of the second semiconductor die 400 through a conductive bump 330 disposed on the ground TSV interconnect belonging to the second array of TSV interconnects 310b. In some embodiments, the second terminal 319 of the ground TSV interconnect 316 may be coupled to the input signal ground (Vss) through the interconnection structure 320 disposed on the front side 306 of the semiconductor substrate 300. Also, the interconnection structure 320 is coupled to the base 200 through the conductive bump 338. As shown in FIG. 1, the ground TSV interconnect 316 is separated from the first array of TSV interconnects 310a and the second array of TSV interconnects 310b by a first distance B1 and a second distance B2, respectively. In some embodiments, at least one of the first distance B1 and the second distance B2 is designed to be larger than the pitch P1 of the first array of TSV interconnects 310a or P2 of the second array of TSV interconnects 310b. Accordingly, the additional ground TSV interconnect 314 and/or 316 of the first semiconductor die 300 can be used to balance the coupling effect between the arrays of pads 402 and 406 of the second semiconductor die 400 along the different directions, such as the directions 410 and 420.

Figure 3A:
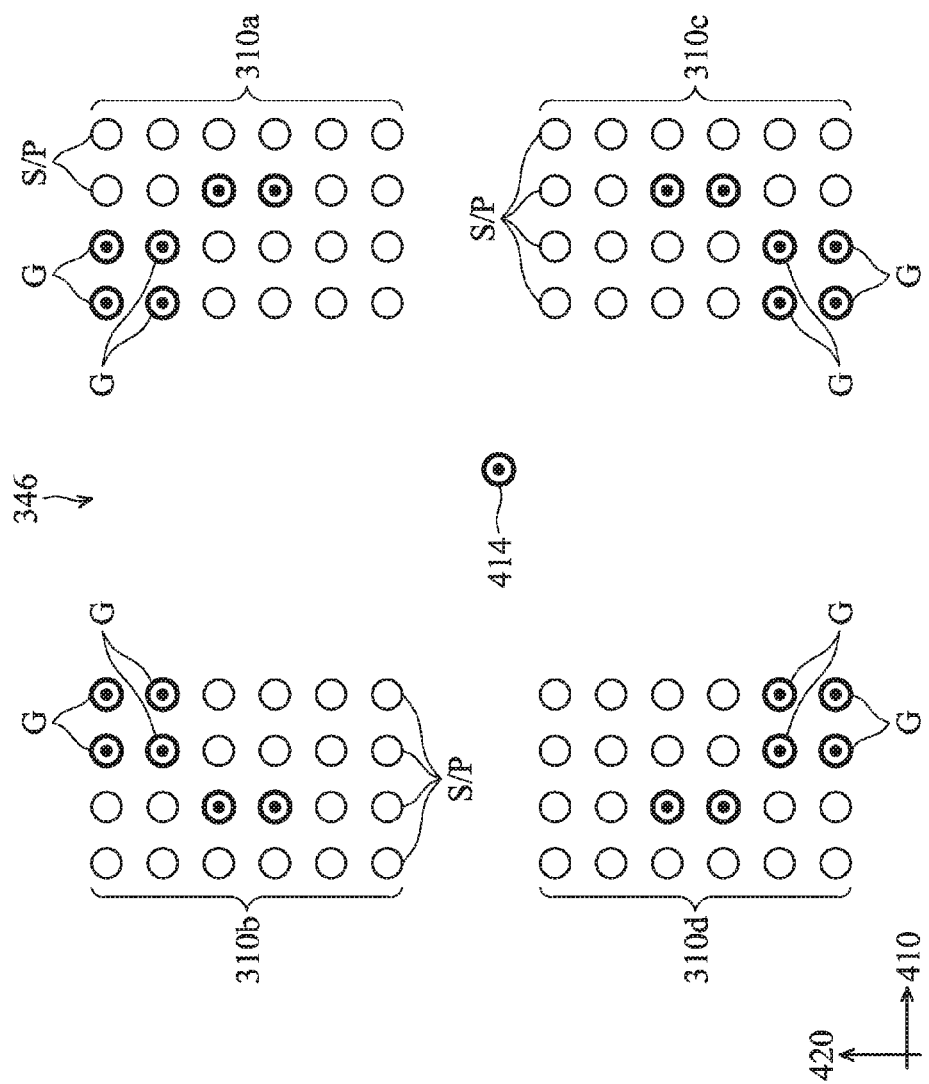
Figure 3B:
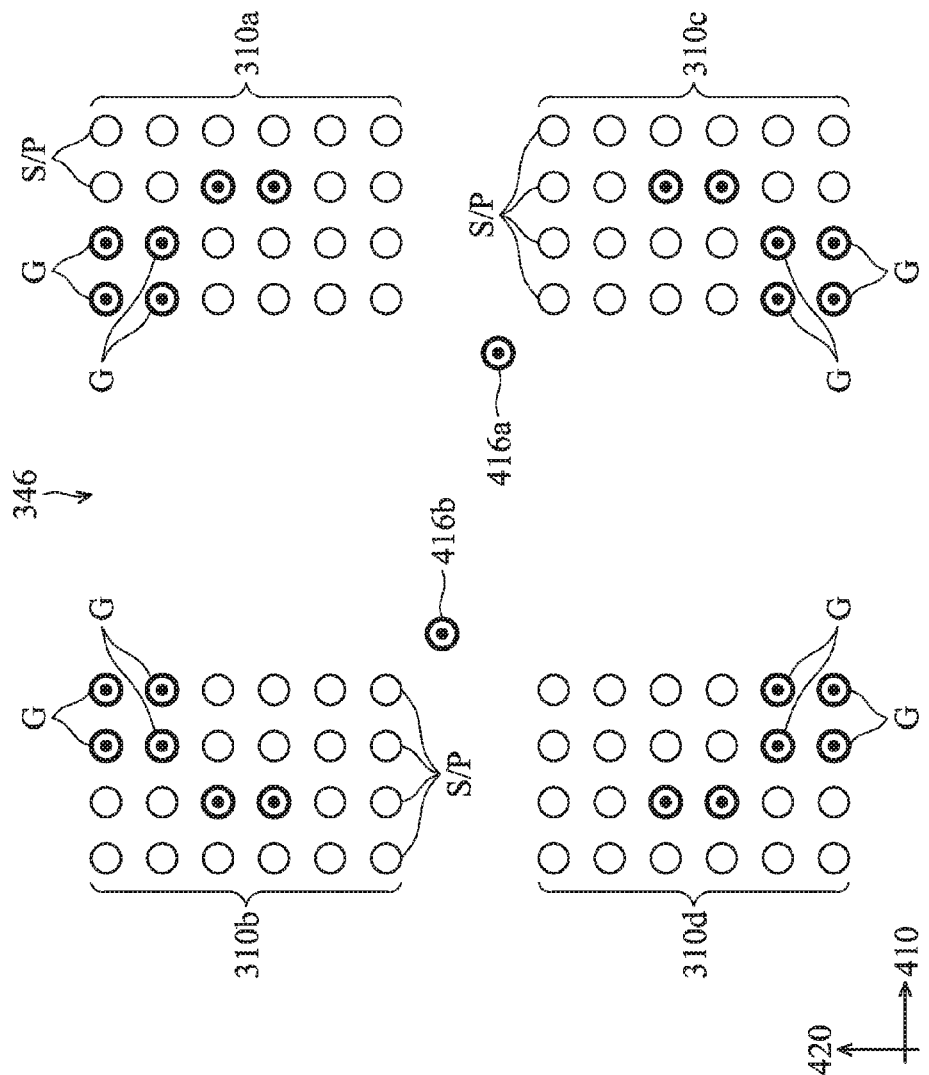
Figure 3D:
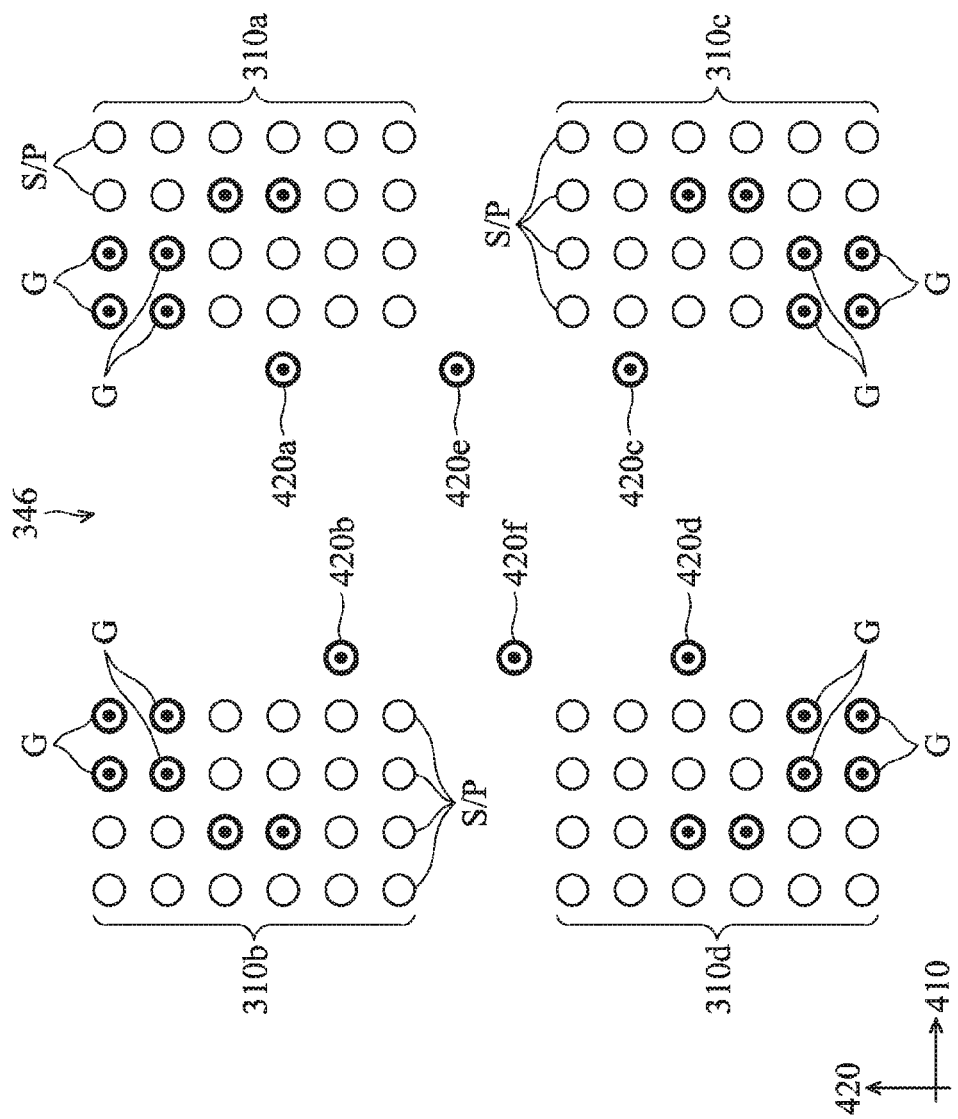
Figure 3E:
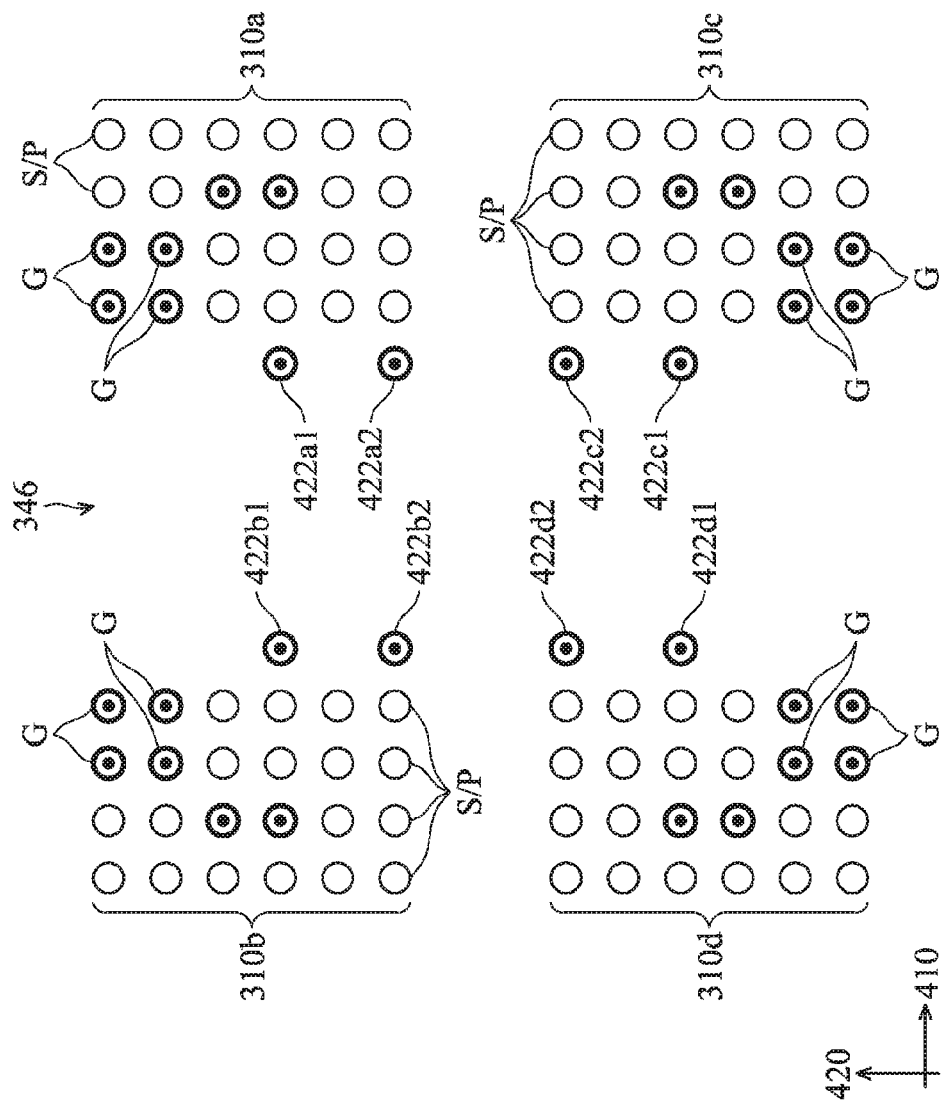

FIGS. 3A to 3G are enlarged views of a region 360 in FIG. 2 showing various arrangements of the ground TSV interconnects disposed within the interval region 346 between the TSV array regions 344-A to 344-D, in accordance with some embodiments of the disclosure. As shown in FIGS. 3A to 3G, elements G with the TSV array regions 344-A to 344-D serve as the ground TSV interconnects. Elements S/P with the TSV array regions 344-A to 344-D serve as the signal or power TSV interconnects. In some embodiments, as shown in FIG. 3A, only one ground TSV interconnect 414 may be disposed within the interval region 346. The ground TSV interconnect 414 may be disposed close to a portion of along the direction 420 to balance the coupling effect between the TSV array regions 344-A to 344-D along the different directions, such as the directions 410 and 420, FIGS. 3B to 3G show the of two ground TSV interconnects (ground TSV interconnects 416a and 416b), four TSV interconnects (ground TSV interconnects 418a to 418b), six TSV interconnects (ground TSV interconnects 420a to 420f), eight TSV interconnects (ground TSV interconnects 422a1, 422a2, 422b1, 422b2, 42c1, 42c2, 422d1 and 422d2), ten TSV interconnects (ground TSV interconnects 422a1, 422a2, 422b1, 422b2, 42c1, 42c2, 422d1, 422d2 422e and 422f), and twenty ground TSV interconnects (ten ground TSV interconnects 426a arranged in a row and ten ground TSV interconnects 426b in another row along the direction 420, for example) arranged within the interval region 346. Similarly, the ground TSV interconnects shown in FIGS. 3B to 3G may be disposed within the interval region 346. The ground TSV interconnect 414 may be disposed close to a portion along the direction 420 to balance the coupling effect between the TSV array regions 344-A to 344-D along the different directions, such as the directions 410 and 420.

Embodiments as shown in FIG. 1 to FIG. 3G provide various ground TSV interconnect arrangements for the three-dimensional (3D) semiconductor package assembly 500. The 3D semiconductor package assembly 500 includes a first semiconductor die 300, such as a logic die, to be disposed on a base 200 and provided for a second semiconductor die 400, such as a DRAM die, directly stacked on. At least one ground TSV interconnect 314 and/or 316 is designed to be disposed within the interval region used to separate the TSV array regions 344-A to 344-D of the semiconductor die 300. The additional ground TSV interconnects 314 and/or 316 are designed to provide additional ground paths to balance the coupling effect between the TSV array regions 344-A to 344-D along the different directions, such as the directions 410 and 420. The additional ground TSV interconnect disposed within the interval region 346 has a first terminal and a second terminal. The first terminal and the second terminal are respectively coupled to the ground pad of the second semiconductor die 400 and an interconnection structure disposed on the front side 306 of the semiconductor substrate 300. In some embodiments, the first terminal is aligned to the back side of the first semiconductor die 300 and coupled to the ground pad of the second semiconductor die 400 through a conductive bump disposed thereon. In some other embodiments, the first terminal aligned to the back side of the first semiconductor die 300 is coupled to the at least one of the ground TSV interconnects of the first array of TSV interconnects 310a or the second array of TSV interconnects 310b of the first semiconductor die 300 through a conductive layer pattern 342, such as a redistribution layer (RDL) pattern. In some embodiments, the second terminal of the additional ground TSV interconnect may be coupled to the input signal ground (Vss) through the interconnection structure disposed thereon. Accordingly, the additional ground TSV interconnects of the first semiconductor die 300 can be used balance the coupling effect between the arrays of pads 402 and 406 of the second semiconductor die 400 along the different directions, such as the directions 410 and 420.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly with a through silicon via (TSV) interconnect, comprising:
    a first semiconductor package mounted on a base, comprising:
        a semiconductor die;
        a semiconductor substrate; and
        a first array of TSV interconnects and a second array of TSV interconnects formed through the semiconductor substrate, wherein the first array and second array of TSV interconnects are separated by an interval region;
    a second semiconductor die mounted on the first semiconductor package, having a ground pad thereon,
    wherein one of the TSV interconnects of the first semiconductor package has a first terminal coupled to the ground pad of the second semiconductor die and a second terminal coupled to an interconnection structure disposed on a front side of the semiconductor substrate facing the base.

2. The semiconductor package assembly with a TSV interconnect as claimed in claim 1, further comprising:
    a first ground TSV interconnect disposed within the interval region,
    wherein the first ground TSV interconnect of the first semiconductor package has a first terminal coupled to the ground pad of the second semiconductor die and a second terminal coupled to the interconnection structure disposed on the front side of the semiconductor substrate.

3. The semiconductor package assembly with a TSV interconnect as claimed in claim 2, wherein the ground pad of the second semiconductor die corresponds to a second ground TSV interconnect of the first array of TSV interconnects or the second array of TSV interconnects of the first semiconductor package.

4. The semiconductor package assembly with a TSV interconnect as claimed in claim 3, wherein the first semiconductor package further comprises:
    a conductive layer pattern disposed on a back side of the semiconductor substrate, in connection with to the first terminal of the first ground TSV interconnect and the second ground TSV interconnect.

5. The semiconductor package assembly with a TSV interconnect as claimed in claim 1, wherein the first terminal is close to a back side of the semiconductor substrate opposite to the front side.

6. The semiconductor package assembly with a TSV interconnect as claimed in claim 1, wherein the second terminal is aligned to the front side of the semiconductor substrate.

7. The semiconductor package assembly with a TSV interconnect as claimed in claim 1, wherein the second terminal is in connection with a first-layer metal pattern of the interconnection structure.

8. The semiconductor package assembly with a TSV interconnect as claimed in claim 1, wherein the interval region having a width greater than a pitch of the first array of TSV interconnects and a pitch of second array of TSV interconnects.

9. The semiconductor package assembly with a TSV interconnect as claimed in claim 1, wherein the second terminal is coupled to the input signal ground (Vss).

10. The semiconductor package assembly with a TSV interconnect as claimed in claim 1, wherein the first semiconductor package further comprises:
a first array of conductive bumps and a second array of conductive bumps disposed on the first semiconductor package and in contact with the base, wherein the first array of conductive bumps corresponds to the first array of TSV interconnects, the second array of conductive bumps corresponds to the second array of TSV interconnects.

11. The semiconductor package assembly with a TSV interconnect as claimed in claim 10, wherein the first semiconductor die further comprises:
a first ground conductive bump disposed within the interval region on the first semiconductor package and in contact with the base, wherein the first ground conductive bump is coupled to the first ground TSV interconnect.

12. A semiconductor package assembly with a through silicon via (TSV) interconnect, comprising:
a first semiconductor package, comprising:
a semiconductor substrate;
a first array of TSV interconnects and a second array of TSV interconnects formed through the semiconductor substrate, wherein the first array and second array of TSV interconnects are separated by an interval region;
a first ground TSV interconnect disposed within the interval region, coupled to an interconnection structure disposed on a front side of the semiconductor substrate; and
a conductive layer pattern disposed on a back side of the semiconductor substrate, in connection with to the first ground TSV interconnect and a second ground TSV interconnect of the first array of TSV interconnects or the second array of TSV interconnects of the first semiconductor package.

13. The semiconductor package assembly with a TSV interconnect as claimed in claim 12, further comprising:
a second semiconductor die mounted on the first semiconductor package, having a ground pad thereon, wherein the conductive layer pattern of the first semiconductor package is coupled to the ground pad of the second semiconductor die.

14. The semiconductor package assembly with a TSV interconnect as claimed in claim 12, wherein the interval region having a width greater than a pitch of the first array of TSV interconnects and a pitch of second array of TSV interconnects.

15. The semiconductor package assembly with a TSV interconnect as claimed in claim 12, wherein the first semiconductor package further comprises:
a first array of conductive bumps and a second array of conductive bumps disposed on the first semiconductor package and in contact with the base, wherein the first array of conductive bumps corresponds to the first array of TSV interconnects, and the second array of conductive bumps corresponds to the second array of TSV interconnects.

16. The semiconductor package assembly with a TSV interconnect as claimed in claim 15, wherein the first semiconductor die further comprises:
a first ground conductive bump disposed within the interval region on the first semiconductor package and in contact with the base, wherein the first ground conductive bump is coupled to the first ground TSV interconnect.

17. A semiconductor package assembly with a through silicon via (TSV) interconnect, comprising:
a first semiconductor package mounted on a base, comprising:
a semiconductor substrate;
a first array of TSV interconnects and a second array of TSV interconnects formed through the semiconductor substrate, wherein the first array and second array of TSV interconnects are separated by an interval region; and
a first ground TSV interconnect disposed within the interval region,
wherein the first ground TSV interconnect of the first semiconductor package has a first terminal coupled to the second array of TSV interconnects of the first semiconductor package and a second terminal coupled to the input signal ground (Vss) through an interconnection structure disposed on a front side of the semiconductor substrate facing the base, and
wherein the first ground TSV interconnect is separated from the first array of TSV interconnects by a first distance larger than a pitch of the first array of TSV interconnects.

18. The semiconductor package assembly with a TSV interconnect as claimed in claim 17, wherein the first semiconductor package further comprises:
a conductive layer pattern disposed on a back side of the semiconductor substrate, in connection with to the first terminal of the first ground TSV interconnect and the second ground TSV interconnect.

19. The semiconductor package assembly with a TSV interconnect as claimed in claim 18, further comprising:
a second semiconductor die mounted on the first semiconductor die, having a ground pad thereon, wherein the conductive layer pattern of the first semiconductor package is coupled to the ground pad of the second semiconductor die.

20. The semiconductor package assembly with a TSV interconnect as claimed in claim 17, wherein the first semiconductor package further comprises:
a first array of conductive bumps and a second array of conductive bumps disposed on the first semiconductor package and in contact with the base, wherein the first array of conductive bumps corresponds to the first array of TSV interconnects, the second array of conductive bumps corresponds to the second array of TSV interconnects.

21. The semiconductor package assembly with a TSV interconnect as claimed in claim 17, wherein the first semiconductor package further comprises:
a first ground conductive bump disposed within the interval region on the first semiconductor package and in contact with the base, wherein the first ground conductive bump is coupled to the first ground TSV interconnect.

* * * * *